(12) United States Patent
Zheng

(10) Patent No.: US 10,445,549 B2
(45) Date of Patent: Oct. 15, 2019

(54) FINGERPRINT IDENTIFICATION DEVICE AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN)

(72) Inventor: Xiao-Bing Zheng, Shenzhen (CN)

(73) Assignees: Interface Technology (ChengDu) Co., Ltd., Chengdu (CN); INTERFACE OPTOELECTRONICS (SHENZHEN) CO., LTD., Shenzhen (CN)

( * ) Notice: Subject to any disclaimer, the term of this patent is extended or adjusted under 35 U.S.C. 154(b) by 74 days.

(21) Appl. No.: 15/706,742

(22) Filed: Sep. 17, 2017

(65) Prior Publication Data
US 2018/0307885 A1 Oct. 25, 2018

(30) Foreign Application Priority Data
Apr. 24, 2017 (CN) .......................... 2017 1 0272311

(51) Int. Cl.
*G06K 9/00* (2006.01)
*H05K 1/03* (2006.01)
*H05K 1/18* (2006.01)

(52) U.S. Cl.
CPC ....... *G06K 9/0002* (2013.01); *G06K 9/00053* (2013.01); *G06K 9/00087* (2013.01); *H05K 1/0393* (2013.01); *H05K 1/189* (2013.01); *H05K 2201/05* (2013.01)

(58) Field of Classification Search
CPC ............. G06K 9/0002; G06K 9/00053; G06K 9/00087; H05K 1/0393
See application file for complete search history.

(56) References Cited

U.S. PATENT DOCUMENTS

| | | | |
|---|---|---|---|
| 9,291,845 B2 * | 3/2016 | Shin ..................... | H05K 5/0086 |
| 2014/0352440 A1 * | 12/2014 | Fennell .................. | G01N 29/22 |
| | | | 73/632 |
| 2016/0107194 A1 * | 4/2016 | Panchawagh ........... | G06F 3/043 |
| | | | 367/140 |
| 2016/0168432 A1 * | 6/2016 | You .................... | C08G 18/8175 |
| | | | 359/893 |
| 2016/0307025 A1 * | 10/2016 | Lee ..................... | G06K 9/00006 |
| 2017/0246662 A1 * | 8/2017 | Kidwell, Jr. .......... | B06B 1/0622 |
| 2017/0325081 A1 * | 11/2017 | Chrisikos ............. | A61B 5/0077 |
| 2017/0364726 A1 * | 12/2017 | Buchan ............. | G01N 29/2437 |

* cited by examiner

*Primary Examiner* — Bhavesh M Mehta
*Assistant Examiner* — Ian L Lemieux
(74) *Attorney, Agent, or Firm* — ScienBiziP, P.C.

(57) ABSTRACT

A fingerprint identification device includes a cover plate, a reinforcing plate, and a fingerprint identification module between the cover plate and the reinforcing plate. The fingerprint identification module is configured to transmit ultrasonic signals and receive reflected ultrasonic signals. An air gap is positioned between the fingerprint identification module and the reinforcing plate.

16 Claims, 4 Drawing Sheets

FINGERPRINT IDENTIFICATION DEVICE AND ELECTRONIC DEVICE USING SAME

FIELD

The subject matter herein generally relates to a fingerprint identification device and an electronic device using the same.

BACKGROUND

Fingerprint identification devices are widely used in electronic devices to achieve identity authentication. There are several types of fingerprint identification devices, such as optical fingerprint identification device, capacitive fingerprint identification device, or ultrasonic fingerprint identification device. The ultrasonic fingerprint identification device usually includes a cover and a fingerprint identification module attached on a side of the cover. The ultrasonic fingerprint identification device further includes a reinforcing plate attached on a side of the fingerprint identification module facing away from the cover. The reinforcing plate is configured to improve the strength of the ultrasonic fingerprint identification device. However, the reinforcing plate reduces a signal sensitivity of the ultrasonic fingerprint identification device. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
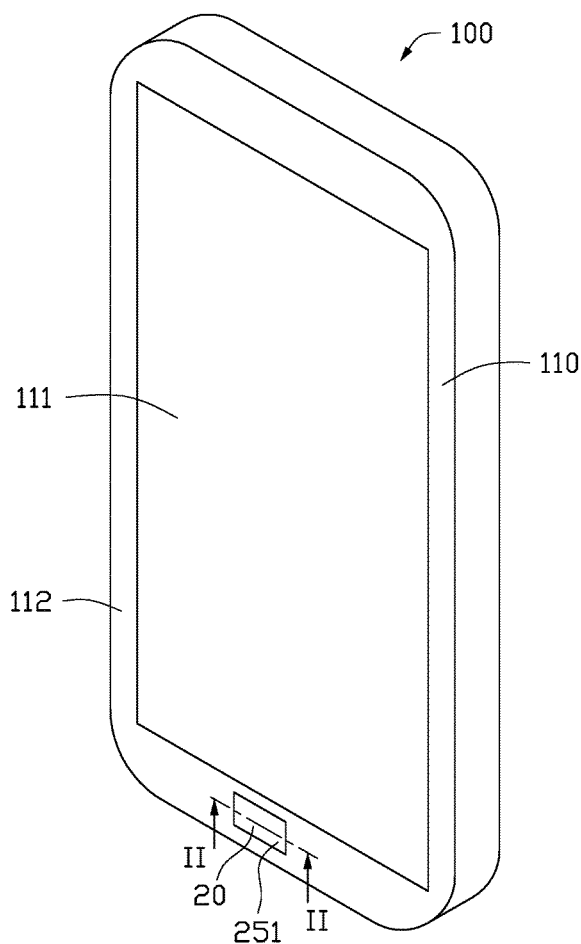
FIG. 1 is an isometric view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 illustrates an electronic device 1 according to an exemplary embodiment. The electronic device 1 may be a mobile phone, a tablet personal computer, a personal digital assistant, or a navigator. In the present exemplary embodiment, the electronic device 1 may be a mobile phone. The electronic device 1 includes a frame cover 110 and a fingerprint identification device 20. The fingerprint identification device 20 is embedded in the frame cover 110 and exposed from the frame cover 110. The frame cover 110 includes a display area 111 and a non-display area 112 surrounding the display area 111. The fingerprint identification device 20 is positioned in the non-display area 112.

Figure 2:
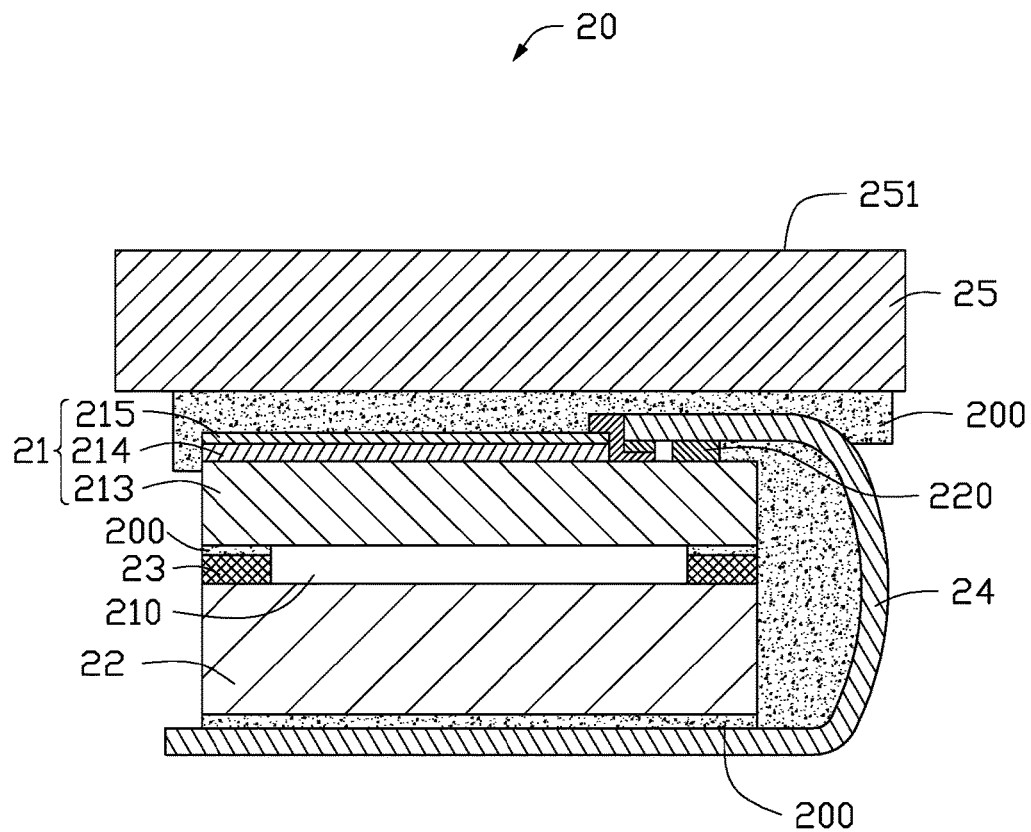
FIG. 2 is a cross-sectional view of a first exemplary embodiment of a fingerprint identification device along line II-II of the electronic device of FIG. 1.

FIG. 2 illustrates the fingerprint identification device 20 according to a first exemplary embodiment. The fingerprint identification device 20 includes a cover plate 25, a fingerprint identification module 21 stacked on the cover plate 25, and a reinforcing plate 22 stacked on the fingerprint identification module 21. The fingerprint identification module 21 is positioned between the cover plate 25 and the reinforcing plate 22. The cover plate 25 includes a surface 251 exposed from the frame cover 110. The surface 251 is configured for being touched by fingers. The fingerprint identification module 21 is coupled to the cover plate 25 by binder 200. An air gap 210 is positioned between the fingerprint identification module 21 and the reinforcing plate 22. In the present exemplary embodiment, the air gap 210 is defined in a supporting frame 23. The supporting frame 23 is positioned between the fingerprint identification module 21 and the reinforcing plate 22. The supporting frame 23 is coupled to the fingerprint identification module 21 by binder 200. The air gap 210 is defined in the supporting frame 23 and extends through the supporting frame 23. The fingerprint identification module 21 is configured to transmit ultrasonic signals and receive ultrasonic signals reflected back by the object (such as a finger) touching the surface 251 of the cover plate 25.

As shown in FIG. 2, the fingerprint identification module 21 includes a thin film transistor substrate 213, a piezoelectric material layer 214 stacked on the thin film transistor substrate 213, and an electrode layer 215 stacked on the piezoelectric material layer 214. The piezoelectric material layer 214 is positioned between the thin film transistor substrate 213 and the electrode layer 215. The electrode layer 215 is positioned between the cover plate 25 and the piezoelectric material layer 214. The thin film transistor substrate 213 is positioned between the reinforcing plate 22 and the piezoelectric material layer 214. The thin film transistor substrate 213 is a conventional thin film transistor substrate and includes electrodes (not shown).

The piezoelectric material layer 214 may be controlled in a time division method. The piezoelectric material layer 214 sends out ultrasonic waves during a signal sending time, and receives ultrasonic waves during a signal receiving time.

During the signal sending time, the electrode layer 215 and the electrodes (not shown) of the thin film transistor substrate 213 cooperatively form an electrical field to drive the piezoelectric material layer 214 to vibrate and send out ultrasonic waves. During the signal receiving time, the piezoelectric material layer 214 receives the reflected ultrasonic waves and produce sensing charges, and the sensing charges are collected by the electrodes (not shown) of the thin film transistor substrate 213.

If the reinforcing plate 22 was in direct contact with the fingerprint identification module 21, it is clear that the reinforcing plate 22 interferes with the ultrasonic signals received by the fingerprint identification module 21. The air gap 210 between the fingerprint identification module 21 and the reinforcing plate 22 reduces the effect of the reinforcing plate 22 on the received ultrasonic signals. Thus, the signal sensitivity of the fingerprint identification device 20 is improved.

As shown in FIG. 2, the fingerprint identification device 20 further includes a flexible printed circuit board 24. The flexible printed circuit board 24 is electrically coupled to the fingerprint identification module 21 to transmit electrical signals from the fingerprint identification module 21 to an outside circuit (not shown).

In the present exemplary embodiment, the flexible printed circuit board 24 is electrically coupled to the thin film transistor substrate 213 by an anisotropic conductive film 220. The piezoelectric material layer 214 partially covers a surface 2130 of the thin film transistor substrate 213. The flexible printed circuit board 24 is positioned in a region of the surface 2130 that not covered by the piezoelectric material layer 214 and extends to cover a side of the reinforcing plate 22 that is facing away from the fingerprint identification module 21.

The cover plate 25 can be made of glass, polymethyl methacrylate (PMMA), polyethersulfone (PES), or polyethylene terephthalate (PET).

The piezoelectric material layer 214 is made of a piezoelectric material, such as polyvinylidene fluoride (PVDF), barium titanate, lead titanate, or lead zirconate titanate (PZT).

The electrode layer 215 may be made of a metal having a good electrical conductivity, such as aluminum, copper, nickel, or gold. The electrode layer 215 may be made of a conductive oxide material, such as indium tin oxide, or indium oxide zinc, but is not limited to the above materials.

The supporting frame 23 may be made of a resin, such as polyimide, epoxy resin, acrylic resin, or rubber. The supporting frame 23 may be made of ink or metal. The support frame 23 has a thickness of between 0.005 mm and 10 mm.

The reinforcing plate 22 may be of a metal or metal alloy, such as aluminum, copper, or iron. The reinforcing plate 22 may be of plastic.

Figure 3:
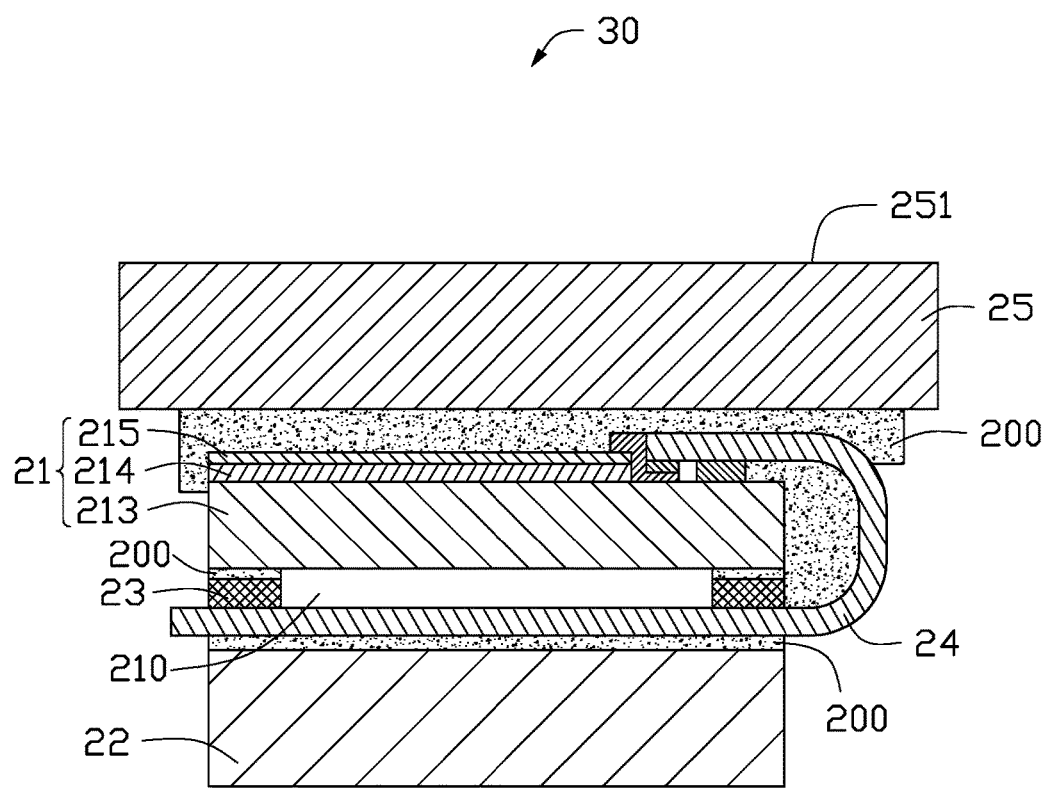
FIG. 3 is a cross-sectional view of a second exemplary embodiment of a fingerprint identification device along line II-II of the electronic device of FIG. 1.

FIG. 3 illustrates the fingerprint identification device 30 according to a second exemplary embodiment. The fingerprint identification device 30 is substantially the same as the fingerprint identification device 20 of the first exemplary embodiment, and includes a cover plate 25, a fingerprint identification module 21 stacked on the cover plate 25, a reinforcing plate 22 stacked on the fingerprint identification module 21, and a flexible printed circuit board 24. The difference between the fingerprint identification device 30 and the fingerprint identification device 20 is that the flexible printed circuit board 24 of the fingerprint identification device 30 extends so as to be between the fingerprint identification module 21 and the reinforcing plate 22. In particular, the flexible printed circuit board 24 extends so as to be positioned between the supporting frame 23 and the reinforcing plate 22. The flexible printed circuit board 24 of the fingerprint identification device 20 also extends to cover a side of the reinforcing plate 22 that faces away from the fingerprint identification module 21.

Figure 4:
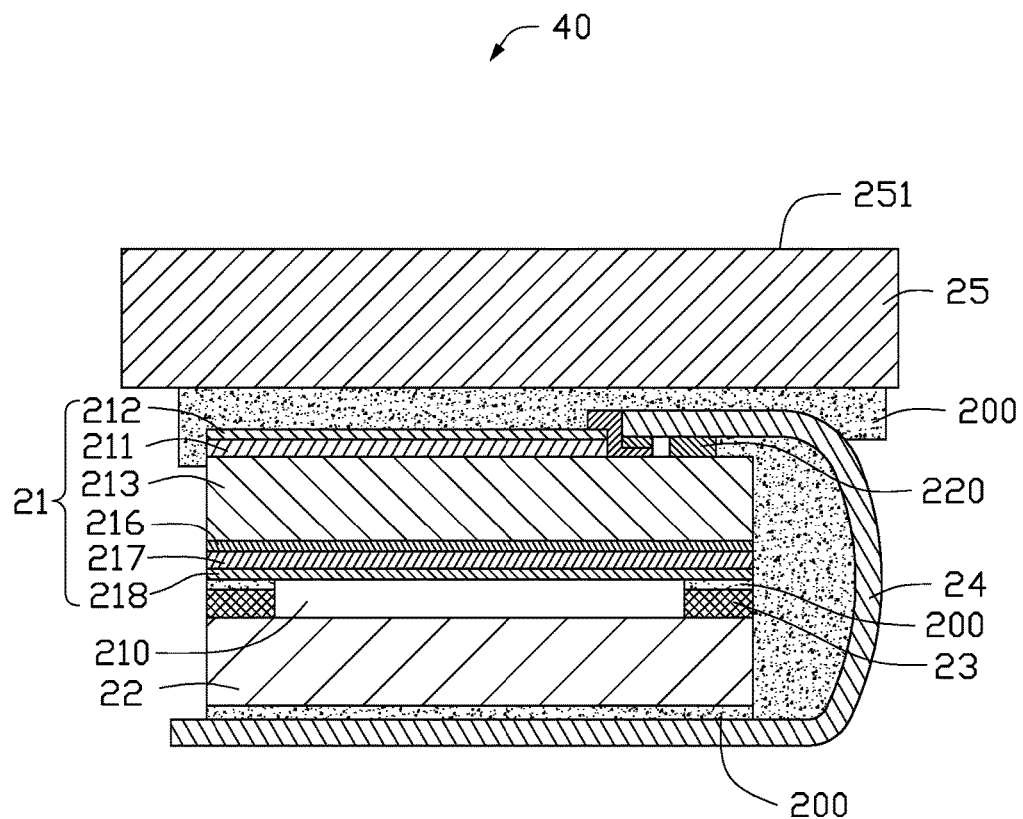
FIG. 4 is a cross-sectional view of a third exemplary embodiment of a fingerprint identification device along line II-II of the electronic device of FIG. 1.

FIG. 4 illustrates the fingerprint identification device 40 according to a third exemplary embodiment. The fingerprint identification device 40 includes a cover plate 25, a fingerprint identification module 21 stacked on the cover plate 25, a reinforcing plate 22 stacked on the fingerprint identification module 21, and a flexible printed circuit board 24. The fingerprint identification module 21 is positioned between the cover plate 25 and the reinforcing plate 22. The cover plate 25 includes a surface 251 exposed from the frame cover 110. The surface 251 is configured for being touched by fingers. The fingerprint identification module 21 is coupled to the cover plate 25 by binder 200. An air gap 210 is positioned between the fingerprint identification module 21 and the reinforcing plate 22. In the present exemplary embodiment, the air gap 210 is defined in a supporting frame 23. The supporting frame 23 is positioned between the fingerprint identification module 21 and the reinforcing plate 22. The supporting frame 23 is coupled to the fingerprint identification module 21 by binder 200. The air gap 210 is defined in the supporting frame 23 and extends through the supporting frame 23.

As shown in FIG. 2, the fingerprint identification module 21 includes a thin film transistor substrate 213. The thin film transistor substrate 213 is a conventional thin film transistor substrate and includes electrodes (not shown).

The fingerprint identification module 21 further includes a first piezoelectric material layer 211 and a first electrode layer 212 stacked on a side of the thin film transistor substrate 213 adjacent to the cover plate 25. The first piezoelectric material layer 211 is configured to receive ultrasonic waves reflected back by the object (such as a finger) touching the surface 251 and produce sensing charges. The sensing charges may be collected by electrodes (not shown) of thin film transistor substrate 213.

The fingerprint identification module 21 further includes a second electrode layer 216, a second piezoelectric material layer 217, and a third electrode layer 218 stacked on a side of the thin film transistor substrate 213 adjacent to the reinforcing plate 22. The second piezoelectric material layer 217 is positioned between the second electrode layer 216 and the third electrode layer 218. The second electrode layer 216 and the third electrode layer 218 cooperatively form an electrical field. The second piezoelectric material layer 217 is capable of vibrating and producing ultrasonic waves under the electrical field.

The flexible printed circuit board 24 is electrically coupled to the fingerprint identification module 21 to transmit electrical signals from the fingerprint identification module 21 to an outside circuit (not shown). In the present exemplary embodiment, the flexible printed circuit board 24 is electrically coupled to the thin film transistor substrate 213 by an anisotropic conductive film 220. The piezoelectric material layer 214 partially covers a surface 2130 of the thin film transistor substrate 213. The flexible printed circuit board 24 is positioned in a region of the surface 2130 that is not covered by the piezoelectric material layer 214 and extends to cover a side of the reinforcing plate 22 that faces away from the fingerprint identification module 21.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A fingerprint identification device comprising:
a cover plate;
a reinforcing plate; and
a fingerprint identification module between the cover plate and the reinforcing plate, the fingerprint identification module configured to transmit ultrasonic signals and receive ultrasonic signals reflected back by an object touching on the cover plate;
wherein an air gap is positioned between the fingerprint identification module and the reinforcing plate;
wherein the fingerprint identification device further comprises a supporting frame positioned between the fingerprint identification module and the reinforcing plate;
a binder is positioned between the supporting frame and the fingerprint identification module to bond the supporting frame to the fingerprint identification module;
the supporting frame is made of metal;
the air gap is defined in the supporting frame and extends through the supporting frame.

2. The fingerprint identification device of claim 1, wherein the fingerprint identification module comprises a thin film transistor substrate, a piezoelectric material layer stacked on the thin film transistor substrate, and an electrode layer stacked on the piezoelectric material layer; the piezoelectric material layer is positioned between the thin film transistor substrate and the electrode layer.

3. The fingerprint identification device of claim 2, wherein the piezoelectric material layer is controlled in a time division method; the piezoelectric material layer sends ultrasonic waves during a signal sending time, and receives ultrasonic waves during a signal receiving time.

4. The fingerprint identification device of claim 2, further comprising a flexible printed circuit board electrically coupled to the fingerprint identification module.

5. The fingerprint identification device of claim 4, wherein the flexible printed circuit board is electrically coupled to the thin film transistor substrate.

6. The fingerprint identification device of claim 5, wherein the piezoelectric material layer partially covers a surface of the thin film transistor substrate; the flexible printed circuit board is positioned in a region of the surface not covered by the piezoelectric material layer and extends to cover a side of the reinforcing plate facing away from the fingerprint identification module.

7. The fingerprint identification device of claim 5, wherein the piezoelectric material layer partially covers a surface of the thin film transistor substrate; the flexible printed circuit board is positioned in a region of the surface not covered by the piezoelectric material layer and extends to be between the fingerprint identification module and the reinforcing plate.

8. The fingerprint identification device of claim 5, wherein the fingerprint identification module comprises a thin film transistor substrate, a first piezoelectric material layer, a first electrode layer, a second electrode layer, a second piezoelectric material layer, and a third electrode layer; the first piezoelectric material layer and the first electrode layer are stacked on a side of the thin film transistor substrate adjacent to the cover plate; the second electrode layer, the second piezoelectric material layer, and the third electrode layer are stacked on a side of the thin film transistor substrate adjacent to the reinforcing plate.

9. The fingerprint identification device of claim 8, further comprising a flexible printed circuit board electrically coupled to the thin film transistor substrate; the first piezoelectric material layer partially covers a surface of the thin film transistor substrate; the flexible printed circuit board is positioned in a region of the surface not covered by the first piezoelectric material layer and extends to cover a side of the reinforcing plate facing away from the fingerprint identification module.

10. An electronic device comprising:
a cover; and
an ultrasonic sensing device embedded in the cover and exposed from the cover;
the ultrasonic sensing device comprising:
a cover plate;
a reinforcing plate; and
a fingerprint identification module between the cover plate and the reinforcing plate, the fingerprint identification module configured to transmit ultrasonic signals and receive ultrasonic signals reflected back by an object touching on the cover plate;
wherein an air gap is positioned between the fingerprint identification module and the reinforcing plate;
wherein the ultrasonic sensing device further comprises a supporting frame positioned between the fingerprint identification module and the reinforcing plate;
a binder is positioned between the supporting frame and the fingerprint identification module to bond the supporting frame to the fingerprint identification module;
the supporting frame is made of metal;
the air gap is defined in the supporting frame and extends through the supporting frame.

11. The electronic device of claim 10, wherein the fingerprint identification module comprises a thin film transistor substrate, a piezoelectric material layer stacked on the thin film transistor substrate, and an electrode layer stacked on the piezoelectric material layer; the piezoelectric material layer is positioned between the thin film transistor substrate and the electrode layer.

12. The electronic device of claim 11, wherein the piezoelectric material layer is controlled in a time division method; the piezoelectric material layer sends ultrasonic waves during a signal sending time, and receives ultrasonic waves during a signal receiving time.

13. The electronic device of claim 11, further comprising a flexible printed circuit board electrically coupled to the thin film transistor substrate.

14. The electronic device of claim 13, wherein the piezoelectric material layer partially covers a surface of the thin film transistor substrate; the flexible printed circuit board is positioned in a region of the surface not covered by the piezoelectric material layer and extends to cover a side of the reinforcing plate facing away from the fingerprint identification module.

15. The electronic device of claim 13, wherein the piezoelectric material layer partially covers a surface of the thin film transistor substrate; the flexible printed circuit board is positioned in a region of the surface not covered by the piezoelectric material layer and extends to be between the fingerprint identification module and the reinforcing plate.

16. The ultrasonic sensing device of claim 10, wherein the fingerprint identification module comprises a thin film transistor substrate, a first piezoelectric material layer, a first electrode layer, a second electrode layer, a second piezoelectric material layer, and a third electrode layer; the first piezoelectric material layer and the first electrode layer are stacked on a side of the thin film transistor substrate adjacent to the cover plate; the second electrode layer, the second piezoelectric material layer, and the third electrode layer are stacked on a side of the thin film transistor substrate adjacent to the reinforcing plate.

* * * * *